United States Patent [19]

Tsuda

[11] Patent Number: 5,686,220
[45] Date of Patent: Nov. 11, 1997

[54] PHOTO-CURING COMPOSITION AND PHOTOSENSITIVE CAPSULE

[75] Inventor: Masashi Tsuda, Aichi-ken, Japan

[73] Assignee: Brother Kogyo Kabushiki Kaisha, Aichi-ken, Japan

[21] Appl. No.: 593,489

[22] Filed: Jan. 30, 1996

[30] Foreign Application Priority Data

Feb. 9, 1995 [JP] Japan .................. 7-021955

[51] Int. Cl.$^6$ .................. G03F 7/031; G03F 7/095
[52] U.S. Cl. .................. 430/138; 430/211; 430/281.1; 430/915; 430/926; 522/7; 522/9; 522/16; 522/26; 522/30
[58] Field of Search .................. 430/138, 915, 430/926, 281.1, 211; 522/7, 26, 30, 9, 16

[56] References Cited

U.S. PATENT DOCUMENTS

| | | | |
|---|---|---|---|
| 2,800,457 | 7/1957 | Green et al. | 252/316 |
| 2,800,458 | 7/1957 | Green et al. | 252/316 |
| 3,495,987 | 2/1970 | Moore | 430/926 |
| 4,551,407 | 11/1985 | Sanders | 430/138 |
| 4,576,891 | 3/1986 | Adair et al. | 430/926 |
| 4,806,446 | 2/1989 | Hatta et al. | 430/138 |
| 4,842,980 | 6/1989 | Gottschalk et al. | 430/138 |
| 4,997,745 | 3/1991 | Kawamura et al. | 430/926 |
| 5,112,721 | 5/1992 | Kuchta | 430/926 |
| 5,236,808 | 8/1993 | Smothers | 430/926 |

FOREIGN PATENT DOCUMENTS

| | | |
|---|---|---|
| 36-9168 | 6/1961 | Japan. |
| 38-19574 | 1/1963 | Japan. |
| 42-771 | 1/1967 | Japan. |
| 51-9079 | 1/1976 | Japan. |
| 5-66559 | 3/1993 | Japan. |
| 5-68871 | 3/1993 | Japan. |
| 5-297552 | 11/1993 | Japan. |
| 952807 | 3/1964 | United Kingdom. |

OTHER PUBLICATIONS

Haner, *The Cyanine Dyes and Related Compounds*, 1964, Interscience Publishers, New York, pp. 511, 518.

*Primary Examiner*—Richard L. Schilling
*Attorney, Agent, or Firm*—Oliff & Berridge

[57] ABSTRACT

A photo-curing composition including an image forming material, an ethylenically unsaturated monomer which is curable by polymerization thereof, a polymerization initiator which initiates the polymerization of the monomer, and two or more photosensitizers each of which absorbs a light and thereby causes the polymerization initiator to initiate the polymerization of the monomer, the photosensitizers having different maximum absorption wavelengths, respectively. A photosensitive capsule including a core material including the photo-curing composition, and a shell material within which the core material is encapsulated.

15 Claims, 3 Drawing Sheets

PHOTO-CURING COMPOSITION AND PHOTOSENSITIVE CAPSULE

BACKGROUND OF THE INVENTION

1. Field of the Invention

The present invention relates to a photo-curing composition and a photosensitive capsule each of which can be used with an image producing device such as a printer.

2. Related Art Statement

There is known the technique of recording an image by using photosensitive capsules. For example, Japanese Patent Applications laid open for inspection under Publication Nos. 5-66559, 5-68871, and 5-297552 disclose a microcapsule toner including photosensitive capsules which are cured when being exposed to light. Also, there is known an image recording medium having a substrate layer, such as a film, and a capsule layer including photosensitive capsules supported on the substrate layer.

Each photosensitive capsule contains a photo-curing composition including an image forming material, such as a dye and a pigment, an ethylenically unsaturated monomer, such as an acrylic monomer, and a polymerization initiator which initiates the polymerization of the monomer. When image recording is carried out, first, the photosensitive capsules are exposed to light having image information, so that the photo-curing composition contained in some capsules is cured because of the polymerization of the monomer but the composition contained in the other capsules is not cured. Next, pressure is applied to all the capsules, cured or uncured. Thus, only the weak, uncured capsules are broken, and the image forming material is bled from the broken capsules. An image is recorded on an image receiving sheet when the bled material is transferred from the broken capsules onto the sheet.

However, the prior photo-curing compositions or the prior photosensitive microcapsules suffer from the problem that the photosensitivity thereof is remarkably reduced because of the addition thereto of the image forming material. Consequently it takes a long time to record an image by using the prior compositions or microcapsules.

SUMMARY OF THE INVENTION

It is therefore a first object of the present invention to provide a photo-curing composition which includes an image forming material such as a dye and a pigment and which can be treated in a short time to produce an image.

It is a second object of the present invention to provide a photosensitive capsule which contains a photo-curing composition including an image forming material and which can be treated in a short time to produce an image.

It is a third object of the present invention to provide an image recording medium which can be treated in a short time to produce an image.

The first object has been achieved according to a first aspect of the present invention, which provides a photo-curing composition comprising an image forming material, at least one ethylenically unsaturated monomer which is curable by polymerization thereof, a polymerization initiator which initiates the polymerization of the monomer; and at least two photosensitizers each of which absorbs a light and thereby causes the polymerization initiator to initiate the polymerization of the monomer, the two photosensitizers having different maximum absorption wavelengths, respectively.

The photo-curing composition in accordance with the first aspect of the present invention absorbs a light having a wider range of wavelengths because of the presence of the two or more photosensitizers having different maximum absorption wavelengths, respectively. In other words, the two or more photosensitizers cooperate with each other to absorb a more amount of light even in a short time, thereby more effectively causing the initiator to initiate the polymerization of the ethylenically unsaturated monomer and cure the monomer or the composition. The image forming material, such as a dye and a pigment, is securely held in the cured monomer or the cured composition and is effectively prevented from bleeding.

According to a preferred feature of the first aspect of the invention, a difference of the maximum absorption wavelengths of the two photosensitizers falls within a range of 10 to 50 nm. In the case where this difference is too large, the photo-curing composition absorbs too wide a range of wavelengths, so that the composition is cured at wavelengths other than desired wavelengths. For example, in the case where a photo-curing composition includes two photosensitizers whose maximum absorption wavelengths are different from each other by about 70 nm, the photo-curing composition absorbs a range of wavelengths which is wider by 20 to 30 nm than a desired range of wavelengths, so that the composition may be cured at wavelengths other than the desired wavelengths. This means that in the case where a full-color image is produced by using, e.g., yellow, magenta, and cyan pigments as the image forming materials, desired colors can be obtained. On the other hand, in the case where the above difference is too small, the photo-curing composition cannot enjoy the effecting of producing an image in a sufficiently short time.

According to another feature of the first aspect of the invention, the image forming material is selected from the group consisting of dyes and pigments.

According to another feature of the first aspect of the invention, the polymerization initiator comprises a photoinitiator which absorbs a light having a specific range of wavelengths and thereby initiates the polymerization of the monomer, and the photosensitizers comprise a wavelength-shifting sensitizer which causes the photoinitiator to initiate the polymerization by absorbing a light having a shifted range of wavelengths including wavelengths longer than the wavelengths of the specific range.

The second object has been achieved according to a second aspect of the present invention, which provides a photosensitive capsule comprising a core material comprising a photo-curing composition according to the first aspect of the invention, and a shell material within which the core material is encapsulated.

The photosensitive capsule in accordance with the second aspect of the invention enjoys the same advantages as the above-described advantages of the photo-curing composition in accordance with the first aspect of the invention. In particular, since the ethylenically unsaturated monomer is cured in a short time when the capsule is exposed to a light having a range of wavelengths defined by the respective maximum absorption wavelengths of the two or more photosensitizers, the image forming material is effectively prevented from bleeding out of the capsule. On the other hand, when the capsule is exposed to a light having a range of wavelengths other than the above-indicated desirable wavelengths, the monomer cannot be cured. If pressure is applied to the uncured capsule, the capsule is broken and the image forming material is bled, so that an image may be recorded on an image receiving or recording sheet.

The third object has been achieved according to a second aspect of the present invention, which provides an image recording medium comprising a capsule layer including a plurality of photosensitive capsules each according to the second aspect of the invention, and a substrate layer which supports the capsule layer.

The image recording medium in accordance with the third aspect of the invention enjoys the same advantages as the above-described advantages of the photosensitive capsule in accordance with the second aspect of the invention. In particular, after an image is developed on the image recording medium, the developed image may be transferred from the medium to an image receiving or recording sheet.

According to a preferred feature of the third aspect of the invention, the photosensitive capsules comprise a first capsule which contains, as the core material thereof, a first photo-curing composition according to the first aspect of the invention, and a second capsule which contains, as the core material thereof, a second photo-curing composition according to the first aspect of the invention, the first photo-curing composition including a first and a second photosensitizer having a first and a second maximum absorption wavelength, respectively, the second photo-curing composition including a third and a fourth photosensitizer having a third and a fourth maximum absorption wavelength, respectively. Each of the first and second maximum absorption wavelengths may be shorter than each of the third and fourth maximum absorption wavelengths.

According to another feature of the third aspect of the invention, the substrate layer comprises a film formed of polyethylene terephthalate (PET).

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
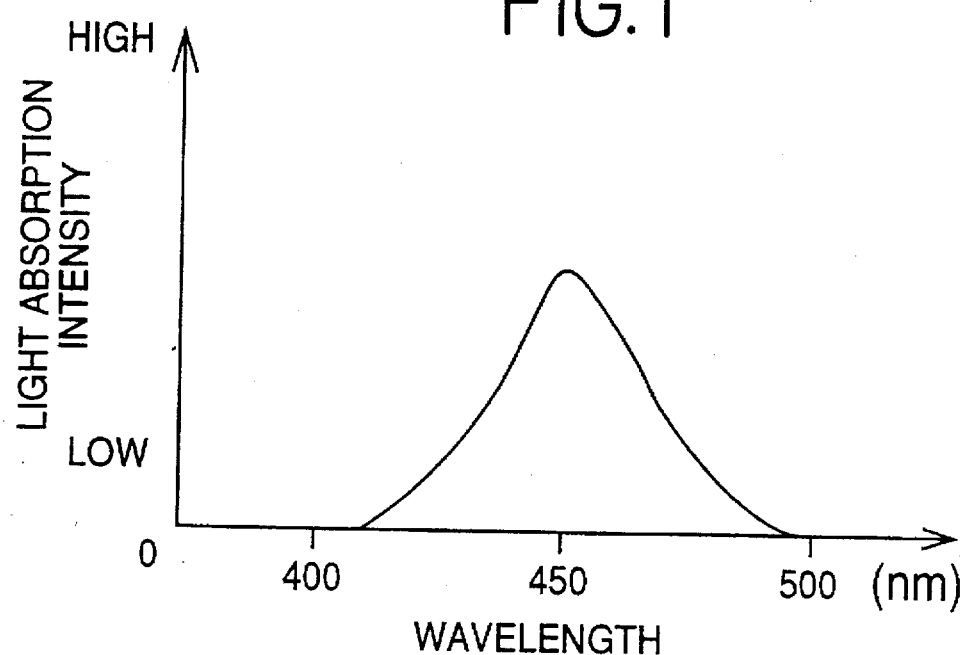
FIG. 1 is a graph showing a relationship between wavelengths and light absorption intensities which is exhibited by a first photosensitizer which may be contained in a first invention photo-curing composition for recording a yellow image.

There will be described in detail a photo-curing composition to which the present invention is applied.

The present photo-curing composition includes an image forming material, such as a dye and a pigment, one or more ethylenically unsaturated monomers which are curable by polymerization thereof, a polymerization initiator which initiates the polymerization of the monomer or monomers, and two or more photosensitizers each of which absorbs a light and thereby causes the polymerization initiator to initiate the polymerization of the monomer or monomers, the photosensitizers having different maximum absorption wavelengths, respectively.

The image forming material may be selected from dyes, organic pigments, inorganic pigments, etc. It is preferred that the image forming material or materials be selected from dyes such as xanthene dyes, coumarin dyes, merocyanine dyes, carbocyanine dyes, styryl dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes, and leuco dyes; organic pigments such as monoazo pigments, disazo pigments, azolake pigments, quinacridone pigments, perylene pigments, anthrapyrimidine pigments, isoindolinone pigments, indanthrene pigments, and phthalocyanine pigments; and inorganic pigments such as carbon black, chrome yellow, red iron oxide, titanium oxide, molybdate orange, cadmium red, cobalt blue, and chrome green.

The ethylenically unsaturated monomer or monomers may be selected from acrylic acid and salts thereof, esters of acrylic acid, acrylamide, methacrylic acid and salts thereof, esters of methacrylic acid, methacrylamide, maleic anhydride, esters of maleic acid, esters of itaconic acid, styrene, vinyl ethers, vinyl esters, N-vinyl heterocyclic compounds, allyl ethers, and allyl esters, and derivatives of those compounds. In particular, the ethylenically unsaturated monomer or monomers is/are selected from esters of acrylic acid and esters of methacrylic acid.

The esters of acrylic acid may be selected from butyl acrylate, cyclohexyl acrylate, ethyhexyl acrylate, benzyl acrylate, furfuryl acrylate, ethoxyethyl acrylate, tricyclodecanyloxy acrylate, nonylphenyloxyethyl acrylate, hexanediol acrylate, 1,3-dioxolane acrylate, hexanediol diacrylate, butanediol diacrylate, neopentylglycol diacrylate, polyethyleneglycol diacrylate, tricyclodecanedimethylol diacrylate, tripropyleneglycol diacrylate, bisphenol A diacrylate, pentaerythritol triacrylate, dipentaerythritol hexaacrylate, hexaacrylate of an addition product obtained by adding caprolactone to dipentaerythritol, trimethylolpropane triacrylate, triacrylate of an addition product obtained by adding propylene oxide to trimethylolpropane, diacrylate of polyoxyethylenated bisphenol A, polyester acrylate, and polyurethane acrylate.

The esters of methacrylic acid may be selected from butyl methacrylate, cyclohexyl methacrylate, ethyhexyl methacrylate, benzyl methacrylate, furfuryl methacrylate, ethoxyethyl methacrylate, hexanediol methacrylate, 1,3-dioxolane methacrylate, hexanediol dimethacrylate, butanediol dimethacrylate, neopentylglycol dimethacrylate, bisphenol A dimethacrylate, pentaerythritol trimethacrylate, dipentaerythritol hexamethacrylate, hexamethacrylate of an addition product obtained by adding caprolactone to dipentaerythritol, trimethylolpropane trimethacrylate, trimethacrylate of an addition product obtained by adding propylene oxide to trimethylolpropane, dimethacrylate of polyoxyethylenated bisphenol A, polyester methacrylate, and polyurethane methacrylate.

The polymerization initiator may be a photocleavage type initiator, a hydrogen-abstraction type initiator, or a bi-molecular-system type initiator. The polymerization initiator or initiators may be selected from photoinitiators such as benzoin ethers, acetophenones, benzophenones, xanthones, organic peroxides, organohalogen compounds, and metal-arene compounds such as iron-arene compounds. A photoinitiator absorbs a light having a specific range of wavelengths and thereby initiates the polymerization of the ethylenically unsaturated monomer or monomers.

Each of the two or more photosensitizers is a wavelength-shifting sensitizer which causes the photoinitiator to initiate the polymerization by absorbing a light having a shifted range of wavelengths including wavelengths longer than the wavelengths of the specific range. The photosensitizers may be selected from dyes such as cyanine dyes, merocyanine dyes, Rhodacyanine dyes, carbocyanine dyes, oxonol dyes, styryl dyes, base styryl dyes, coumarin dyes, and squarilium dyes. It is preferred that a difference between the maximum absorption wavelengths of the two or more photosensitizers fall within the range of 10 to 50 nm. A maximum absorption wavelength of a compound is defined as a wavelength of a light at which the compound exhibits a maximum absorption of the light.

Hereinafter, there will be described the results of the experiments which are carried out by the Inventors for ascertaining the characteristic effects of the photo-curing compositions as embodiments of the present invention. In this connection, it is to be understood that the invention photo-curing composition is not limited to the details of those embodiments and may otherwise be embodied by changing component materials with other materials and/or changing respective contents of the component materials.

EXPERIMENT 1

Experiment 1 relates to a photo-curing composition suitable for recording a yellow image. In Experiment 1, a first example of the invention photo-curing composition which contains a yellow pigment and, as the photosensitizers, two sorts of dyes having different maximum absorption wavelengths, and a first comparative photo-curing composition which contains the same yellow pigment and only one of the two same dyes, are prepared and are compared with each other with respect to photosensitivity.

INVENTION EXAMPLE 1

Figure 2:
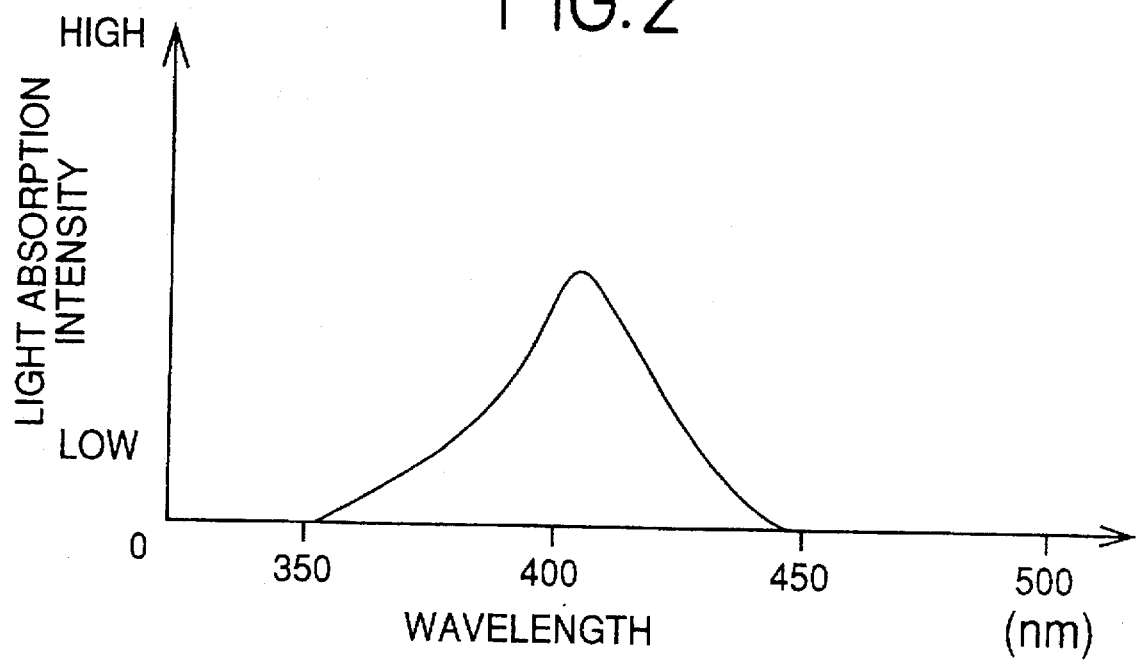
FIG. 2 is a graph showing a relationship between wavelengths and light absorption intensities which is exhibited by a second photosensitizer which may be contained in the first invention photo-curing composition.
Figure 3:
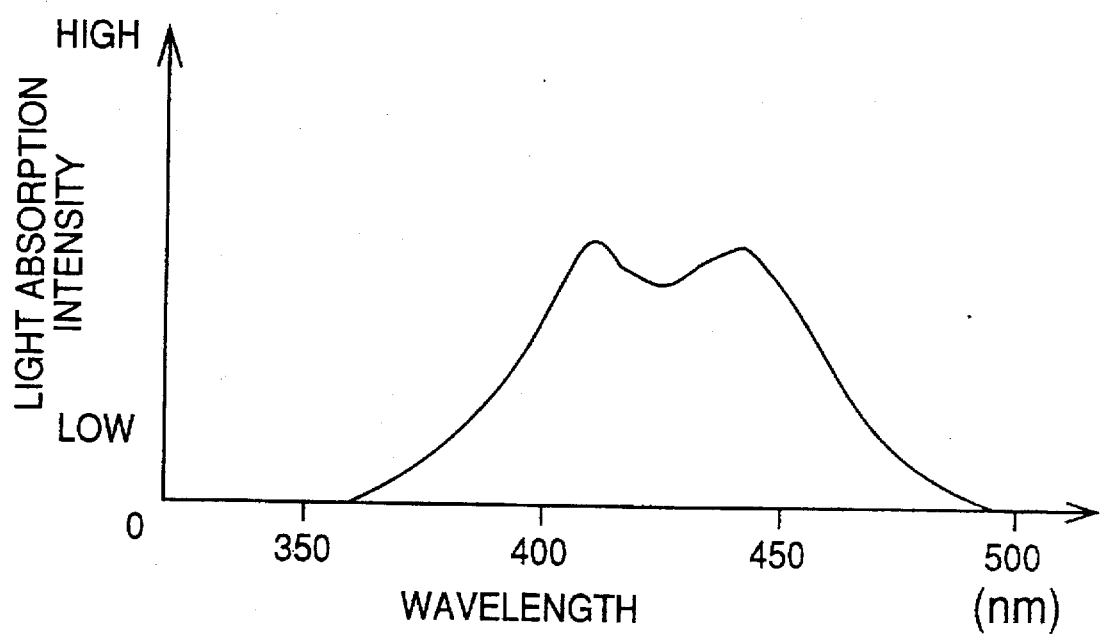
FIG. 3 is a graph showing a relationship between wavelengths and light absorption intensities which is exhibited by the first invention photo-curing composition in which both the first and second photosensitizers are contained.

The first invention example or composition contains a first photosensitizer having a maximum absorption wavelength of 449 nm, as shown in FIG. 1, and a second photosensitizer having a maximum absorption wavelength of 402 nm, as shown in FIG. 2. Thus, the first invention composition exhibits a relationship between wavelengths and light absorption intensities, as shown in FIG. 3.

First, a mixture of ethylenically unsaturated monomers is obtained by mixing 3 parts by weight of dipentaerythritol hexaacrylate and 1 part by weight of phenol acrylate. 3 parts by weight of an azo barium lake pigment (i.e., "Permanent Yellow GG-02" available from HOECHST, Germany) is dispersed in 100 parts weight of the thus obtained mixture using polyurethane as a pigment-dispersing agent. 0.2 part by weight of a coumarin dye (i.e., 7-dimethylamino-3-thenoylcoumarin) having a maximum absorption wavelength of 449 nm; 0.2 part by weight of a base styryl dye (i.e., 2-[2-[4-(dimethylamino)phenyl]ethenyl] benzothiazole) having a maximum absorption wavelength of 402 nm; and 1 part by weight of N,N-dimethyl-aniline as a chemical sensitizer are added to the thus obtained material, and additionally 2 parts by weight of ($\eta^5$-2,4-cyclopentadiene-1-yl)[(1,2,3,4,5,6-$\eta$)-(1-methylethyl) benzene]iron(1+)hexafluorophosphate(1−) is added and heated at 100° C. for five minutes. Thus, the first invention composition is obtained.

COMPARATIVE EXAMPLE 1

The first comparative composition is different from the first invention composition in that the 0.2 part by weight of the coumarin dye and the 0.2 part by weight of the base styryl dye are replaced by 0.4 part by weight of the coumarin dye having the maximum absorption wavelength of 449 nm, in the first comparative composition. The other components and contents of the first comparative composition are the same as those of the first invention composition.

MEASUREMENT OF PHOTOSENSITIVITY

Each of the first invention and comparative photo-curing compositions is applied to a transparent PET (polyethylene terephthalate) film, so that a layer of each composition having a thickness of about 10 μm is formed on the PET film. Another PET film is superposed on each composition layer for the purpose of isolating each layer from oxygen. The thus obtained test sample is set on a spectral-sensitivity measuring device available from NARUMI, a Japanese company. Thus, the photosensitivity of each composition is measured at a wavelength of 450 nm. The measurement results are shown in Table. The least energy with which the first invention composition is cured is used as a standard value (=100), and the least energy with which the first comparative composition is cured is evaluated in terms of a value relative to the standard value. The smaller the relative value is, the higher the photosensitivity is.

EXPERIMENT 2

Experiment 2 relates to a photo-curing composition suitable for recording a magenta image. In Experiment 2, a second example of the invention photo-curing composition which contains a magenta pigment and also contains, as the photosensitizers, two sorts of dyes having different maximum absorption wavelengths, and a second comparative photo-curing composition which contains the same magenta pigment and only one of the two same dyes, are prepared and are compared with each other with respect to photosensitivity.

TABLE

|  | RELATIVE SENSITIVITY |
|---|---|
| INVENTION EXAMPLE 1 | 100 |
| COMPARATIVE EXAMPLE 1 | 95 |
| INVENTION EXAMPLE 2 | 105 |
| COMPARATIVE EXAMPLE 2 | 100 |
| INVENTION EXAMPLE 3 | 90 |
| COMPARATIVE EXAMPLE 3 | 90 |

INVENTION EXAMPLE 2

The second invention composition contains a first photosensitizer having a maximum absorption wavelength of 586 nm, and a second photosensitizer having a maximum absorption wavelength of 545 nm. The photosensitivity of the second invention composition is measured.

The second invention composition is different from the first invention composition in that the 3 parts by weight of the azo barium lake pigment of the first invention composition is replaced by 3 parts by weight of a quinacridone dye (i.e., "Cinquasia Magenta RT-235D" available from CIBA-GEIGY, Switzerland), in the second invention composition and that the 0.2 part by weight of the coumarin dye and the 0.2 part by weight of the base styryl dye of the first invention composition are replaced by 0.2 part by weight of a cyanine dye (i.e., 2-[3-(1,3-dihydro-1,1,3-trimethyl-2H-benz[e]indol-2-ylidene)-1-propenyl]-1,1,3-trimethyl-1H-benz[e]indolium iodode) having a maximum absorption wavelength of 586 nm and 0.2 part by weight of a carbocyanine dye (i.e., 3',6'-bis(diethylamino)-fluoran) having a maximum absorption wavelength of 545 nm, in the second invention composition. The other components and contents of the second invention composition are the same as those of the first invention composition.

COMPARATIVE EXAMPLE 2

The second comparative composition is different from the second invention composition in that the 0.2 part by weight of cyanine dye and the 0.2 part by weight of carbocyanine dye of the second invention composition are replaced by 0.4 part by weight of the carbocyanine dye having the maximum absorption wavelength of 545 nm. The other components and contents of the second comparative composition are the same as those of the second invention composition.

The photosensitivity of each of the second invention and comparative photo-curing compositions is measured in the same manner as described above with respect to Experiment 1, except that a light having a wavelength of 550 nm is used to irradiate each layer. The measurement results are shown in Table.

EXPERIMENT 3

Experiment 3 relates to a photo-curing composition suitable for recording a cyan image. In Experiment 3, a third example of the invention photo-curing composition which contains a cyan pigment and, as the photosensitizers, two sorts of dyes having different maximum absorption wavelengths, and a third comparative photo-curing composition which contains the same cyan pigment and only one of the two same dyes, are prepared and are compared with each other with respect to photosensitivity.

INVENTION EXAMPLE 3

The third invention composition contains a first photosensitizer having a maximum absorption wavelength of 660 nm, and a second photosensitizer having a maximum absorption wavelength of 632 nm. The photosensitivity of the third invention composition is measured.

The third invention composition is different from the first invention composition in that the 3 parts by weight of azo barium lake pigment of the first invention composition is replaced by 3 parts by weight of a phthalocyanine dye (i.e., "Helogen Blue D7072D" available from BASF, Germany), in the third invention composition and that the 0.2 part by weight of coumarin dye and the 0.2 part by weight of base styryl dye of the first invention composition are replaced by 0.2 part by weight of a first sort of squarilium dye having a maximum absorption wavelength of 660 nm and 0.2 part by weight of a second sort of squarilium dye having a maximum absorption wavelength of 632 nm, in the third invention composition. The other components and contents of the third invention composition are the same as those of the first invention composition.

COMPARATIVE EXAMPLE 3

The third comparative composition is different from the third invention composition in that the 0.2 part by weight of first sort of squarilium dye and the 0.2 part by weight of second sort of squarilium dye of the third invention composition are replaced by 0.4 part by weight of the second sort of squarilium dye having the maximum absorption wavelength of 632 nm. The other components and contents of the third comparative composition are the same as those of the third invention composition.

The photosensitivity of each of the third invention and comparative photo-curing compositions is measured in the same manner as described above with respect to Experiment 1, except that a light having a wavelength of 650 nm is used to irradiate each layer. The measurement results are shown in Table.

Figure 4A:
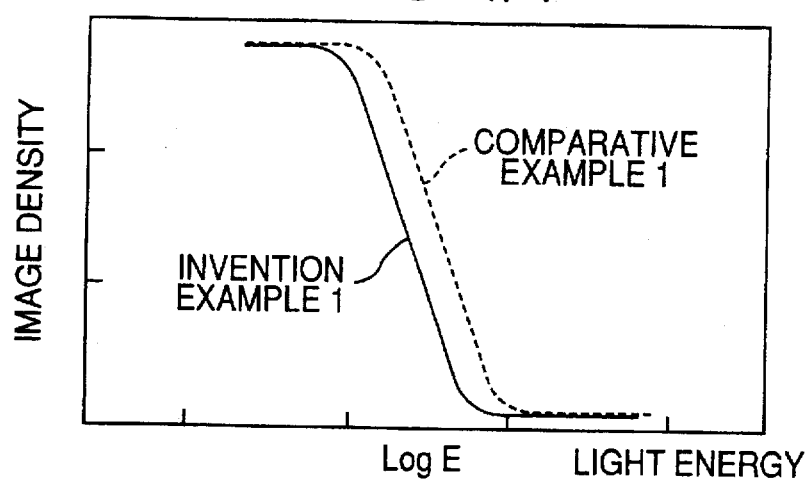
FIG. 4A is a graph showing a relationship between amounts of light energy and image densities which is exhibited by the first invention photo-curing composition and a relationship which is exhibited by a first comparative photo-curing composition.
Figure 4B:
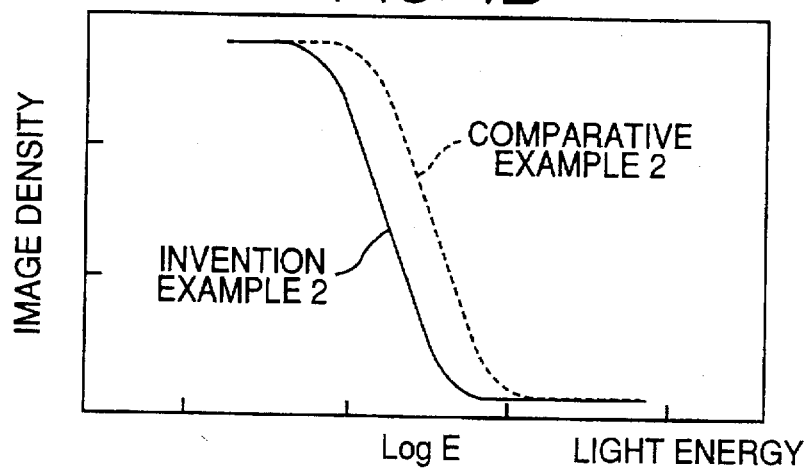
FIG. 4B is a graph showing a relationship between amounts of light energy and image densities which is exhibited by a second invention photo-curing composition for recording a magenta image and a relationship which is exhibited by a second comparative photo-curing composition.
Figure 4C:
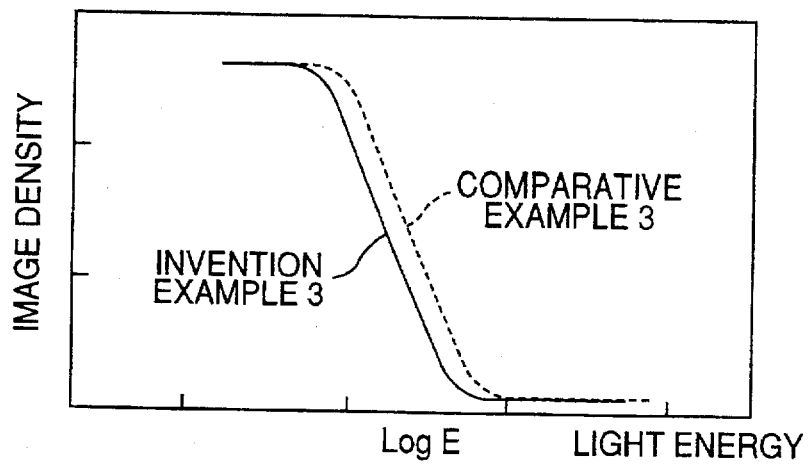
FIG. 4C is a graph showing a relationship between amounts of light energy and image densities which is exhibited by a third invention photo-curing composition for recording a cyan image and a relationship which is exhibited by a third comparative photo-curing composition.

FIGS. 4A, 4B, and 4C shows respective characteristic curves of the first invention and comparative photo-curing compositions, the second invention and comparative photo-curing compositions, and the third invention and comparative photo-curing compositions, respectively. Each characteristic curve or graph represents a relationship between amounts of light energy and image densities. The amounts of light energy correspond to lights which are transmitted through respective films having stepwise different transmittances (e.g., step tablets) and which are used to irradiate each photo-curing composition, or each layer thereof. While the amounts of light energy are changed to irradiate respective sample layers of each invention or comparative composition through the respective step tablets, image densities are measured on images which are recorded on respective image receiving sheets when the sheets are superposed on the irradiated sample layers and the pigment bleeding from uncured portions of each sample layer is transferred to each sheet. The image densities are measured by a Macbeth densitometer. The amounts of light energy (1x·sec) are calculated based on the respective luminous flux densities measured on the sample layers and the respective transmittances of the step tablets. The characteristic curves shown in FIGS. 4A to 4C are provided by plotting the thus obtained data points. In the case where each composition is irradiated with a large amount of light energy, the composition is cured, and the image forming material contained therein is fixed and is not transferred to an image receiving or recording sheet. The image recorded with the thus cured composition has a low density. On the other hand, in the case where each composition is irradiated with a small amount of light energy, the composition is not cured so much, and the image forming material contained therein is transferred to an image recording sheet. The image thus recorded on the sheet has a high density.

As is apparent from the experiment results shown in Table, there is substantially no difference between the invention compositions and the comparative compositions with respect to photosensitivity measured at a particular wavelength. However, the characteristic curves shown in FIGS. 4A to 4C apparently indicate that the curves of the invention compositions 1, 2, and 3 are located on the low-energy side of the curves of the corresponding comparative compositions 1, 2, and 3. This means that the invention compositions are cured with less amounts of energy than those with which the comparative compositions are cured, and therefore that the invention compositions can be cured in shorter times of exposure.

Thus, it is ascertained that the invention photo-curing composition can be cured in a shorter time of exposure than the time in which the previously-described conventional compositions are cured, and that an image recording operation can be carried out in a shorter time by using the invention composition.

Next, there will be described photosensitive capsules or microcapsules each of which contains the above-described invention photo-curing composition as a core material. The photosensitive capsules embody the present invention as well.

Each of the photosensitive capsules additionally includes an outer shell within with the core material is encapsulated. Although it is preferred that the photosensitive capsules have a mean grain size of 5 to 50 μm, the capsules may have a smaller or larger size.

The photosensitive capsules in accordance with the present invention may be produced by any of the conventional methods known in the art. For example, the capsules may be produced by the "phase separation" method disclosed in, e.g., U.S. Pat. No. 2,800,457 and U.S. Pat. No. 2,800,458; the "interfacial polymerization" method disclosed in, e.g., Japanese Patent Applications laid open for opposition under Publication Nos. 38-19574, 42-446, and 42-771; the "in-situ polymerization" method disclosed in, e.g., Japanese Patent Application laid open for opposition under Publication No. 36-9168 and Japanese Patent Application laid open for inspection under Publication No. 51-9079; or the "dispersing and cooling" method disclosed in British Patent No. 952807. Otherwise, the present photosensitive capsules may be produced by different methods.

The outer shell of each capsule may be formed of a material, inorganic or organic, which may be employed in the capsule producing method used. It is preferred that the outer shell be formed of an organic material which permits a large amount of light to pass therethrough.

The shell material may be selected from gelatin, gum arabic, starch, sodium alginate, polyvinyl alcohol, polyethylene, polyamide, polyester, polyurethane, polyurea, polystyrene, nitrocellulose, ethylcellulose, methylcellulose, melamine-formaldehyde resin, and urea-formaldehyde resin.

Next, there will be described some embodiments of the photosensitive capsule in accordance with the present invention. In this connection, it is to be understood that the invention capsule is not limited to the details of those embodiments and may otherwise be embodied by changing component materials with other materials, and/or changing respective contents of the component materials and/or conditions under which the capsules are produced.

A first photosensitive capsules which are suitable for recording a yellow image are produced. The first capsules contain a yellow pigment and are photosensitive to a light having wavelengths around 450 nm.

The first capsules contain, as the core material, the first invention photo-curing composition prepared in Experiment 1.

First, 5% water solution of polystyrene sulfonic acid (partly present in the form of sodium salt thereof) as an emulsifier and 5% water solution of styrene-maleic anhydride copolymer are mixed in equal amounts, and the first invention photo-curing composition prepared in Experiment 1 is added to 100 cc of the thus obtained water solution. This mixture is agitated by a homogenizer, at 6,000 rpm (rotations per minute) for five minutes, so that a so-called O/W (oil-water) emulsion in which liquid drops having a size of 5 to 20 μm are present in water is obtained.

Meanwhile, a commercially available powder of melamine is added to 37% water solution of formaldehyde, and this solution is adjusted to pH 9.0 using sodium hydroxide solution and is heated at 60° C. for 30 minutes. Thus, a melamine-formaldehyde prepolymer is obtained. This melamine-formaldehyde prepolymer is added to the above-indicated O/W emulsion and this mixture is heated at 80° C. for 5 hours while being agitated at 100 to 300 rpm by, e.g. an agihomomixer. Subsequently, the mixture is adjusted to pH 7 and is cooled down to room temperature. As a result, an outer wall or shell of melamine-formaldehyde resin is precipitated around each of the liquid drops in the O/W emulsion. Thus, the first invention photosensitive capsules are produced.

A second invention photosensitive capsules for recording a magenta image and a third invention photo-curing capsules for recording a cyan image are produced by using the second and third invention photo-curing compositions prepared in Experiments 2 and 3, respectively, in the same manner as described above for the first invention photosensitive capsules.

The first to third invention photosensitive capsules are evaluated with respect to photosensitivity in the same manner as described above for Experiments 1 to 3. Although there is a tendency that the photosensitivities of the invention photosensitive capsules are slightly lower than those of the invention photo-curing compositions. However, regarding the other properties, there is no difference between the invention capsules and the invention compositions. Accordingly, the other results obtained from the experiments carried out on the invention capsules are not shown.

Moreover, according to the present invention, there is provided an image recording medium having a capsule layer including a plurality of photosensitive capsules, and a substrate layer which supports the capsule layer. The photosensitive capsules may include one, two, or all of the above-described first to third invention photosensitive capsules corresponding to the yellow, magenta, and cyan colors, and/or include a fourth invention photosensitive capsules corresponding to a black color. The substrate layer may be provided by a film formed of PET (polyethylene terephthalate). An image developed on the image recording medium may be transferred onto a separate, image receiving or recording sheet.

It is to be understood that the present invention may be embodied with other changes, improvements, and modifications that occur to those skilled in the art without departing from the scope and spirit of the invention defined in the appended claims.

What is claimed is:

1. An image recording medium comprising:
   capsule layer comprising a plurality of photosensitive capsules; and
   a substrate layer which supports said capsule layer,
   wherein said plurality of photosensitive capsules comprise a first and a second capsule,
   wherein said first capsule contains:
   (A) a first core material comprising a first photo-curing composition comprising:
      a first image forming material;

at least one first ethylenically unsaturated monomer which is curable by polymerization thereof;

a first polymerization initiator which initiates the polymerization of said first monomer; and a first and a second photosensitizer each of which absorbs a light and thereby causes said first polymerization initiator to initiate said polymerization of said first monomer, said first and second photosensitizers having a first and a second maximum absorption wavelength, respectively, a difference of said first and second maximum absorption wavelengths falling within a range of from 10 to 50 nm, wherein said first and second photosensitizers are selected from the group consisting of cyanine dyes, merocyanine dyes, Rhodacyanine dyes, carbocyanine dyes, oxonol dyes, styryl dyes, base styryl dyes, coumarin dyes, and squarilium dyes; and (B) a first shell material within which said first core material is encapsulated, and wherein said second capsule contains:

(A) a second core material comprising a second photocuring composition comprising:

a second image forming material;

at least one second ethylenically unsaturated monomer which is curable by polymerization thereof;

a second polymerization initiator which initiates the polymerization of said second monomer; and a third and a fourth photosensitizer each of which absorbs a light and thereby causes said second polymerization initiator to initiate said polymerization of said second monomer, said third and fourth photosensitizers having a third and a fourth maximum absorption wavelength, respectively, a difference of said third and fourth maximum absorption wavelengths falling within a range from 10 to 50 nm, wherein said third and fourth photosensitizers are selected from the group consisting of cyanine dyes, merocyanine dyes, Rhodacyanine dyes, carbocyanine dyes, oxonol dyes, styryl dyes, base styryl dyes, coumarin dyes, and squarilium dyes; and (B) a second shell material within which said second core material is encapsulated.

2. An image recording medium according to claim 1, wherein each of said first and second maximum absorption wavelengths is shorter than each of said third and fourth maximum absorption wavelengths.

3. An image recording medium according to claim 1, wherein each of said first and second image forming materials is selected from the group consisting of dyes and pigments.

4. An image recording medium according to claim 1, wherein each of said first and second image forming materials comprises at least one dye selected from the group consisting of xanthene dyes, coumarin dyes, merocyanine dyes, carbocyanine dyes, styryl dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes, and leuco dyes.

5. An image recording medium according to claim 1, wherein each of said first and second image forming materials comprises at least one organic pigment selected from the group consisting of monoazo pigments, disazo pigments, azolake pigments, quinacridone pigments, perylene pigments, anthrapyrimidine pigments, iso-indolinone pigments, indanthrene pigments, and phthalocyanine pigments.

6. An image recording medium according to claim 1, wherein each of said first and second image forming materials comprises at least one inorganic pigment selected from the group consisting of carbon black, chrome yellow, red iron oxide, titanium oxide, molybdate orange, cadmium red, cobalt blue, and chrome green.

7. An image recording medium according to claim 1, wherein each of said first and second ethylenically unsaturated monomers is selected from the group consisting of acrylic acid and salts thereof, esters of acrylic acid, acrylamide, methacrylic acid and salts thereof, esters of methacrylic acid, methacrylamide, maleic, anhydride, esters of maleic acid, esters of itaconic acid, styrene, vinyl ethers, vinyl esters, N-vinyl heterocyclic compounds, allyl ethers, and allyl esters, and derivatives thereof.

8. An image recording medium according to claim 7, wherein said ester of acrylic acid is selected from the group consisting of butyl acrylate, cyclohexyl acrylate, ethyhexyl acrylate, benzyl acrylate, furfuryl acrylate, ethoxyethyl acrylate, tricyclodecanyloxy acrylate, nonylphenyloxyethyl acrylate, hexanediol acrylate, 1,3-dioxolane acrylate, hexanediol diacrylate, butanediol diacrylate, neopentylglycol diacrylate, polyethyleneglycol diacrylate, tricyclodecanedimethylol diacrylate, tripropyleneglycol diacrylate, bisphenol A diacrylate, pentaerythritol triacrylate, dipentaerythritol hexaacrylate, hexaacrylate of an addition product obtained by adding caprolactone to dipentaerythritol, trimethylolpropane triacrylate, triacrylate of an addition product obtained by adding propylene oxide to trimethylolpropane, diacrylate of polyoxyethylenated bisphenol A, polyester acrylate, and polyurethane acrylate.

9. An image recording medium according to claim 7, wherein said ester of methacrylic acid is selected from the group consisting of butyl methacrylate, cyclohexyl methacrylate, ethyhexyl methacrylate, benzyl methacrylate, furfuryl methacrylate, ethoxyethyl methacrylate, hexanediol methacrylate, 1,3-dioxolane methacrylate, hexanediol dimethacrylate, butanediol dimethacrylate, neopentylglycol dimethacrylate, bisphenol A dimethacrylate, pentaerythritol trimethacrylate, dipentaerythritol hexamethacrylate, hexamethacrylate of an addition product obtained by adding caprolactone to dipentaerythritol, trimethylolpropane trimethacrylate, trimethacrylate of an addition product obtained by adding propylene oxide to trimethylolpropane, dimethacrylate of polyoxyethylenated bisphenol A, polyester methacrylate, and polyurethane methacrylate.

10. An image recording medium according to claim 1, wherein said first and second polymerization initiators comprise respective photoinitiators each of which absorbs a light having a specific range of wavelengths and thereby initiates the polymerization of a corresponding one of said first and second monomers, and each of said first and second photosensitizers and said third and fourth photosensitizers comprise a wavelength-shifting sensitizer which causes a corresponding one of said respective photoinitiators to initiate the polymerization of a corresponding one of said first and second monomers, by absorbing a light having a shifted range of wavelengths including wavelengths longer than the wavelengths of the specific range therefor.

11. An image recording medium according to claim 1, wherein each of said first and second polymerization initiators is selected from the group consisting of benzoin ethers, acetophenones, benzophenones, xanthones, organic peroxides, organohalogen compounds, and metal-arene compounds.

12. An image recording medium according to claim 1, wherein each of said first and second shell materials is selected from the group consisting of gelatin, gum arabic, starch, sodium alginate, polyvinyl alcohol, polyethylene, polyamide, polyester, polyurethane, polyurea, polystyrene, nitrocellulose, ethylcellulose, methylcellulose, malamine-formaldehyde resin, and urea-formaldehyde resin.

13. An image recording medium according to claim 1, wherein said plurality of photosensitive capsules further comprises a third capsule which contains:

(A) a third core material comprising a third photo-curing composition comprising:

a third image forming material;

at least one third ethylenically unsaturated monomer which is curable by polymerization thereof;

a third polymerization initiator which initiates the polymerization of said third monomer; and a fifth and a sixth photosensitizer each of which absorbs a light and thereby causes said third polymerization initiator to initiate said polymerization of said third monomer, said fifth and sixth photosensitizers having a fifth and a sixth maximum absorption wavelength, respectively, a difference of said fifth and sixth maximum absorption wavelengths falling within a range from 10 to 50 nm, wherein said fifth and sixth photosensitizers are selected from the group consisting of cyanine dyes, merocyanine dyes, Rhodacyanine dyes, carbocyanine dyes, oxonol dyes, styryl dyes, base styryl dyes, coumarin dyes, and squarilium dyes; and (B) a third shell material within which said third core material is encapsulated, said first photo-curing composition including said first image forming material for forming an image having a first color, said second photo-curing composition including said second image forming material for forming an image having a second color, said third photo-curing composition including said third image forming material for forming an image having a third color, each of said first and second maximum absorption wavelengths being shorter than each of said third and fourth maximum absorption wavelengths, each of said third and fourth maximum absorption wavelengths being shorter than each of said fifth and sixth maximum absorption wavelengths.

14. An image recording medium according to claim 1, wherein said substrate layer comprises a film formed of polyethylene terephthalate.

15. An image recording medium according to claim 12, wherein said metal-arene compounds comprise iron-arene compounds.

* * * * *

UNITED STATES PATENT AND TRADEMARK OFFICE
CERTIFICATE OF CORRECTION

PATENT NO. : 5,686,220
DATED : November 11, 1997
INVENTOR(S) : Masashi TSUDA

It is certified that error appears in the above-indentified patent and that said Letters Patent is hereby corrected as shown below:

On the title page, in item [56], References Cited "Foreign Patent Documents", please add:

--42-446    01/1967    Japan--

Signed and Sealed this

Twentieth Day of January, 1998

Attest:

BRUCE LEHMAN

Attesting Officer  Commissioner of Patents and Trademarks